US010931291B1

(12) United States Patent
Patnaik

(10) Patent No.: US 10,931,291 B1
(45) Date of Patent: Feb. 23, 2021

(54) SYSTEM FOR MULTIPLE PLL SYNCHRONIZATION

(71) Applicant: AMAZON TECHNOLOGIES, INC., Seattle, WA (US)

(72) Inventor: Satwik Patnaik, Seattle, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 16/921,069

(22) Filed: Jul. 6, 2020

(51) Int. Cl.
H03L 7/197 (2006.01)
H03L 7/089 (2006.01)
H03L 7/093 (2006.01)

(52) U.S. Cl.
CPC ......... H03L 7/1976 (2013.01); H03L 7/0891 (2013.01); H03L 7/093 (2013.01)

(58) Field of Classification Search
CPC combination set(s) only.
See application file for complete search history.

(56) References Cited

U.S. PATENT DOCUMENTS

| 8,588,329 | B2* | 11/2013 | Lamanna | H03L 7/1976 |
| | | | | 375/295 |
| 8,994,420 | B2 | 3/2015 | Eldredge | H03L 7/1976 |
| | | | | 327/156 |
| 2004/0012423 | A1* | 1/2004 | Maeda | H03L 7/23 |
| | | | | 327/156 |
| 2011/0006936 | A1* | 1/2011 | Lin | H03L 7/085 |
| | | | | 341/143 |
| 2011/0019767 | A1* | 1/2011 | Lamanna | H04L 7/0331 |
| | | | | 375/295 |
| 2012/0063521 | A1* | 3/2012 | Shin | H03L 7/081 |
| | | | | 375/259 |
| 2012/0176202 | A1* | 7/2012 | Chen | H03L 7/1976 |
| | | | | 331/34 |
| 2014/0062537 | A1* | 3/2014 | Kitsukawa | H03L 7/23 |
| | | | | 327/107 |
| 2015/0084676 | A1* | 3/2015 | McLaurin | H03L 7/23 |
| | | | | 327/142 |

(Continued)

OTHER PUBLICATIONS

"Fractional N PLL with Delta Sigma Modulator", The MathWorks, Inc. 1994-2020. Retrieved from the Internet: URL: https://www.mathworks.com/help/msblks/ref/fractionalnpllwithdeltasigmamodulator.html.

(Continued)

Primary Examiner — Adam D Houston
(74) Attorney, Agent, or Firm — Lindauer Law, PLLC

(57) ABSTRACT

An array of devices, such as transceivers on a satellite, each use a phase locked loop (PLL) system to maintain a local oscillator at a particular frequency that is synchronized to a reference clock signal (RCS), maintaining tight timing discipline among the PLL systems. Each PLL system includes a first delta sigma modulator (DSM) and a second DSM. During a first time, a divider uses output from the first DSM to divide output from a voltage controlled oscillator of the PLL system. The output from the divider is provided as feedback to a phase frequency detector (PFD) of the PLL system and is also provided to the clock input of the first DSM. The PFD accepts as input the RCS. The second DSM uses the RCS as clock input. At a second time, the PLL system transitions from the divider using output from the first DSM to the second DSM.

20 Claims, 7 Drawing Sheets

(56) References Cited

U.S. PATENT DOCUMENTS

| | | | |
|---|---|---|---|
| 2015/0145566 A1* | 5/2015 | Perrott | H03L 7/0802 |
| | | | 327/154 |
| 2016/0301522 A1* | 10/2016 | Tetzlaff | H04L 43/022 |
| 2017/0324419 A1* | 11/2017 | Mayer | H03L 7/235 |
| 2018/0138899 A1* | 5/2018 | Tee | H03L 7/23 |

OTHER PUBLICATIONS

Baker, Bonnie, "How delta-sigma ADCs work, Part 1", Texas Instruments Incorporated, Data Acquisition, Analog Applications Journal, 3Q 2011, 6 pages. Retrieved from the Internet: URL: https://www.ti.com/lit/an/slyt423a/slyt423a.pdf.

Collins, Ian, "Phase-Locked Loop (PLL) Fundamentals", Analog Dialogue 52-07, Jul. 2018, pp. 1-6. Retrieved from the Internet: URL: https://www.analog.com/media/en/analog-dialogue/volume-52/number-3/phase-locked-loop-pll-fundamentals.pdf.

Curtin, et al., "Phase-Locked Loops for High-Frequency Receivers and Transmitters—Part 1", Analog Dialogue, Mar. 1999, vol. 33. Retrieved from the Internet: URL: http://www.analog.com/en/analog-dialogue/articles/pll-for-high-frequency-receivers-and-transmitters-1.html.

Texas Instruments, "AN-1879 Fractional N Frequency Synthesis", Application Report, SNAA062A—Dec. 2008—Revised Apr. 2013, 37 pages. Retrieved from the Internet: URL: https://www.ti.com/lit/an/snaa062a/snaa062a.pdf.

Texas Instruments, "Fractional/Integer-N PLL Basics", Technical Brief SWRA029, Edited by Curtis Barrett, Wireless Communication Business Unit, Aug. 1999, 55 pages. Retrieved from the Internet: URL: https://www.ti.com/lit/an/swra029/swra029.pdf.

* cited by examiner

SYSTEM FOR MULTIPLE PLL SYNCHRONIZATION

BACKGROUND

Wireless transmission of data provides many benefits. Satellites and other devices may wirelessly transfer data between different locations.

BRIEF DESCRIPTION OF FIGURES

The detailed description is set forth with reference to the accompanying figures. In the figures, the left-most digit(s) of a reference number identifies the figure in which the reference number first appears. The use of the same reference numbers in different figures indicates similar or identical items or features. The figures are not necessarily drawn to scale, and in some figures, the proportions or other aspects may be exaggerated to facilitate comprehension of particular aspects.

Figure 1:
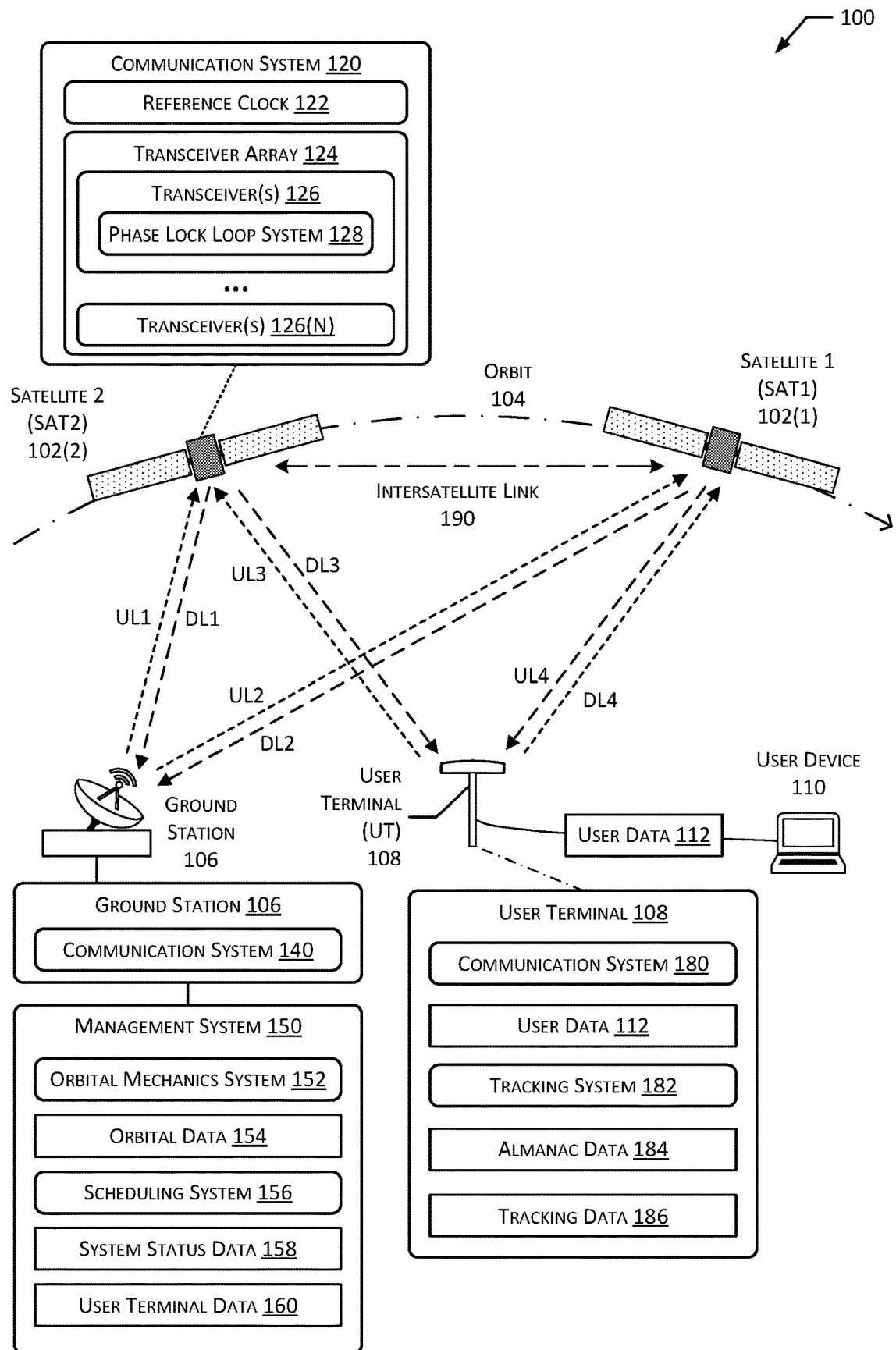
FIG. 1 illustrates a system using ground stations and a constellation of satellites each with a plurality of transceivers that have phase-locked loops (Pas) synchronized to a reference clock, according to some implementations.

While implementations are described herein by way of example, those skilled in the art will recognize that the implementations are not limited to the examples or figures described. It should be understood that the figures and detailed description thereto are not intended to limit implementations to the particular form disclosed but, on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean "including, but not limited to".

DETAILED DESCRIPTION

The ability to transmit data wirelessly provides tremendous utility. Wireless transmission uses one or more frequencies of electromagnetic signals, such as radio frequency (RF) signals, to send information. Transceivers comprising transmitters and receivers are used to send and receive these electromagnetic signals. A satellite or other device that is providing communication to many other devices may include a transceiver array. For example, a transceiver array onboard a satellite may have approximately 4,000 discrete transceivers. These transceivers may use fractional phase-locked loops (Pas) to provide a signal for frequency and timing. The PLL uses a feedback loop to adjust its own output frequency to a desired stable state. There are generally two kinds of PLL: integer-N and fractional-N. Integer-N Pas use a divider circuit that only divides in integer multiples of a source frequency. In comparison, fractional-N Pas allow for a division that may include a fractional value. Fractional-N Pas offer several advantages compared to integer-N Pas, including improved frequency resolution, lower phase noise in some situations, and so forth. However, in part because of this flexibility, groups of fractional-N Pas are more difficult to synchronize with one another.

A single transceiver or set of transceivers on a common die may use a "free running" PLL in which it uses its own clock to determine those frequency and timing signals. However, in a situation where many transceivers are in use, it is advantageous to synchronize those Pas so they share common timing. For example, by having all of the Pas in the transceiver array operating in synchronization with a single reference clock, it is possible to use the output from the transceiver array with a phased array antenna. A phased array antenna contains many elements and uses slight differences in timing or phase of the signals to produce a beamforming effect that directs a signal to transmit or receive in a particular direction relative to the phased array antenna. If the timing of those signals is off, the beamforming effect may be impaired or fail entirely. This can adversely affect operation of the transceivers and the communication they would otherwise be providing.

The components used in the circuitry for each individual PLL vary somewhat from others during operation. This variation results from differences in manufacture, voltage during operation, temperature during operation, and so forth. As a result, each PLL will run a bit differently from others in the transceiver array, with some PLLs faster than others, some slower, and so forth. Because integer-N PLLs only look to integer values of their reference signal, synchronization among many integer-N PLLs is relatively straightforward. However, synchronizing fractional-N PLLs is substantially more difficult. For example, when comparing the output from several fractional-N PLLs, the fractional nature of operation can result in a situation where it is unclear where the beginning or end of a particular group of signals that corresponds to a set of reference clock signals is.

Traditional techniques to synchronize fractional-N PLLs have involved numerous tradeoffs. For example, some systems use many electrical components to achieve synchronization. These components increase size, cost, and power consumption of the system. As a result, they do not scale well into progressively larger arrays. Traditional techniques also take extended periods of time to achieve synchronization. While in the process of synchronizing PLLs, the transceivers are not able to send or receive data. As a result of the delays imposed by those traditional techniques, the amount of time that the transceiver array is able to send and receive data is reduced, reducing operational throughput.

Described in this disclosure is circuitry and techniques to rapidly synchronize large arrays of PLLs to a reference clock that may be used in devices such as an array of transceivers. The resulting PLL circuitry described in this disclosure is compact and power efficient. The circuitry also allows for synchronization of PLLs with different characteristics. For example, the PLLs synchronized in an array may have individual variations in a loop filter bandwidth by an order of magnitude and still synchronize. Individual variations in PLL performance due to process, voltage, and temperature are easily accommodated. Testing of one implementation indicates that multiple fractional-N Pas are tightly synchronized to the reference clock and thus one another in well under 120 microseconds. As a result, the output from a transceiver array so synchronized may be used in conjunction with digital beamforming techniques.

The circuitry comprises a fractional-PLL system comprising a first delta sigma modulator (DSM) and a second DSM. A reference clock provides a reference clock signal that is used by the PLL system described herein. During a first time, a divider uses output from the first DSM to divide output from a voltage controlled oscillator (VCO) of the PLL system. The output from the divider is provided to a phase frequency detector (PFD) of the PLL system to provide feedback, and also to the clock input of the first DSM. A second DSM receives clock input from the reference clock. At a second time, the PLL system transitions from using the first DSM to using the second DSM. During the first time, the PLL system moves into relatively coarse time alignment with the reference clock. After transitioning to the second DSM, the PLL is now in fine alignment with the reference clock. Due to the operation of the PLL, that fine alignment is maintained. The transition from use of the first DSM to the second DSM may occur at a preset time. For example, switching circuitry may transition at the preset time from providing output from the first DSM to the divider to providing output from the second DSM to the divider. The fractional-PLL system may be implemented as discrete components, an application specific integrated circuit (ASIC), by a field programmable gate array (FPGA), and so forth.

The system may be used in a variety of applications including, but not limited to intersatellite communications, communications between satellite and ground station, communications between satellite and user terminals, between vehicles, between terrestrial stations, and so forth. For example, the system may be used in terrestrial applications, mobile applications, industrial control and monitoring systems, and so forth.

Illustrative System

The ability to communicate between two or more locations that are physically separated provides substantial benefits. Communications over areas ranging from counties, states, continents, oceans, and the entire planet are used to enable a variety of activities including health and safety, logistics, remote sensing, interpersonal communication, and so forth.

Communications facilitated by electronics use electromagnetic signals, such as radio waves or light to send information over a distance. These electromagnetic signals have a maximum speed in a vacuum of 299,792,458 meters per second, known as the "speed of light" and abbreviated "c". Electromagnetic signals may travel, or propagate, best when there is an unobstructed path between the antenna of the transmitter and the antenna of the receiver. This path may be referred to as a "line of sight". While electromagnetic signals may bend or bounce, the ideal situation for communication is often a line of sight that is unobstructed. Electromagnetic signals will also experience some spreading or dispersion. Just as ripples in a pond will spread out, a radio signal or a spot of light from a laser will spread out at progressively larger distances.

As height above ground increases, the area on the ground that is visible from that elevated point increases. For example, the higher you go in a building or on a mountain, the farther you can see. The same is true for the electromagnetic signals used to provide communication service. A relay station having a radio receiver and transmitter with their antennas placed high above the ground is able to "see" more ground and provide communication service to a larger area.

There are limits to how tall a structure can be built and where. For example, it is not cost effective to build a 2000 meter tall tower in a remote area to provide communication service to a small number of users. However, if that relay station is placed on a satellite high in space, that satellite is able to "see" a large area, potentially providing communication services to many users across a large geographic area. In this situation, the cost of building and operating the satellite is distributed across many different users and becomes cost effective.

A satellite may be maintained in space for months or years by placing it into orbit around the Earth. The movement of the satellite in orbit is directly related to the height above ground. For example, the greater the altitude the longer the period of time it takes for a satellite to complete a single orbit. A satellite in a geosynchronous orbit at an altitude of 35,800 km may appear to be fixed with respect to the ground because of the period that the geosynchronous orbit matches the rotation of the Earth. In comparison, a satellite in a non-geosynchronous orbit (NGO) will appear to move with respect to the Earth. For example, a satellite in a circular orbit at 600 km will circle the Earth about every 96 minutes. To an observer on the ground, the satellite in the 600 km orbit will speed by, moving from horizon to horizon in a matter of minutes.

Building, launching, and operating a satellite is costly. Traditionally, geosynchronous satellites have been used for broadcast and communication services because they appear stationary to users on or near the Earth and they can cover very large areas. This simplifies the equipment needed by a station on or near the ground to track the satellite.

However, there are limits as to how many geosynchronous satellites may be provided. For example, the number of "slots" or orbital positions that can be occupied by geosynchronous satellites are limited due to technical requirements, regulations, treaties, and so forth. It is also costly in terms of fuel to place a satellite in such a high orbit, increasing the cost of launching the satellite.

The high altitude of the geosynchronous satellite can introduce another problem when it comes to sharing electromagnetic spectrum. The geosynchronous satellite can "see" so much of the Earth that special antennas may be needed to focus radio signals to particular areas, such as a particular portion of a continent or ocean, to avoid interfering with radio services on the ground in other areas that are using the same radio frequencies.

Using a geosynchronous satellite to provide communication service also introduces a significant latency or delay because of the time it takes for a signal to travel up to the satellite in geosynchronous orbit and back down to a device on or near the ground. The latency due to signal propagation time of a single hop can be at least 240 milliseconds (ms).

To alleviate these and other issues, satellites in NGOs may be used. The altitude of an NGO is high enough to provide coverage to a large portion of the ground, while remaining low enough to minimize latency due to signal propagation time. For example, the satellite at 600 km only introduces 4 ms of latency for a single hop. The lower altitude also reduces the distance the electromagnetic signal has to travel. Compared to the geosynchronous orbit, the reduced distance of the NGO reduces the dispersion of electromagnetic signals. This allows the satellite in NGO as well as the device communicating with the satellite to use a less powerful transmitter, use smaller antennas, and so forth.

The system 100 shown here comprises a plurality (or "constellation") of satellites 102(1), 102(2), . . . , 102(S), each satellite 102 being in orbit 104. Also shown is a ground station 106, user terminal (UT) 108, and a user device 110.

The constellation may comprise hundreds or thousands of satellites 102, in various orbits 104. For example, one or more of these satellites 102 may be in non-geosynchronous orbits (NGOs) in which they are in constant motion with respect to the Earth. For example, the orbit 104 is a low earth orbit (LEO). In this illustration, the orbit 104 is depicted with an arc pointed to the right. A first satellite (SAT1) 102(1) is leading (ahead of) a second satellite (SAT2) 102(2) in the orbit 104.

The satellite 102 comprises a communication system 120. For example, the communication system 120 may include one or more modems, digital signal processors, power amplifiers, antennas (including at least one antenna that implements multiple antenna elements, such as a phased array antenna), processors, memories, storage devices, communications peripherals, interface buses, and so forth. The communication system 120 may include a reference clock 122. In some implementations the reference clock 122 may be disciplined using an external source. For example, the reference clock 122 may be disciplined using data from a precision timing source, such as a global navigation satellite system (GNSS). The reference clock 122 provides as output a reference clock signal. The communication system 120 comprises a transceiver array 124 comprising a plurality of transceivers 126(1), 126(2), . . . , 126(N). For example, the transceiver array 124 may comprise a plurality of transceiver assemblies, with each transceiver assembly comprising a plurality of transceivers 126. For example, the transceiver array 124 may comprise 30 transceiver assemblies, each transceiver assembly comprising 144 individual transceivers 126 on that chip. Each transceiver 126, or a subset of transceivers 126, comprises a fractional-N phase lock loop (PLL) system 128. For example, the transceiver assembly, such as a single ASIC chip, may comprise a PLL system 128 and a plurality of transceivers 126. The PLL system 128 is synchronized to the reference clock signal provided by the reference clock 122. The PLL system 128 may operate as the local oscillator (LO) for the transceiver 126.

The PLL system 128 provides tight synchronization for the transceivers 126 in the transceiver array 124. Because the output from the transceivers 126 is tightly synchronized, the input to and output from the transceiver array 124 may be readily adjusted by introducing intentional phase delays to produce beamforming effects when operated in conjunction with a phased array antenna. Without the tight timing synchronization, phase errors would significantly impair or prevent effective beamforming. The satellite 102 is discussed in more detail with regard to FIG. 2. The PLL system 128 is discussed in more detail below.

One or more ground stations 106 are in communication with one or more satellites 102. The ground stations 106 may pass data between the satellites 102, a management system 150, networks such as the Internet, and so forth. The ground stations 106 may be emplaced on land, on vehicles, at sea, and so forth. Each ground station 106 may comprise a communication system 140. Each ground station 106 may use the communication system 140 to establish communication with one or more satellites 102, other ground stations 106, and so forth. The ground station 106 may also be connected to one or more communication networks. For example, the ground station 106 may connect to a terrestrial fiber optic communication network. The ground station 106 may act as a network gateway, passing user data 112 or other data between the one or more communication networks and the satellites 102. Such data may be processed by the ground station 106 and communicated via the communication system 140. The communication system 140 of a ground station 106 may include components similar to those of the communication system 120 of a satellite 102 and may perform similar communication functionalities. For example, the communication system 140 may include one or more modems, digital signal processors, power amplifiers, antennas (including at least one antenna that implements multiple antenna elements, such as a phased array antenna), processors, memories, storage devices, communications peripherals, interface buses, and so forth.

The ground stations 106 are in communication with a management system 150. The management system 150 is also in communication, via the ground stations 106, with the satellites 102 and the UTs 108. The management system 150 coordinates operation of the satellites 102, ground stations 106, UTs 108, and other resources of the system 100. The management system 150 may comprise one or more of an orbital mechanics system 152 or a scheduling system 156.

The orbital mechanics system 152 determines orbital data 154 that is indicative of a state of a particular satellite 102 at a specified time. In one implementation, the orbital mechanics system 152 may use orbital elements that represent characteristics of the orbit 104 of the satellites 102 in the constellation to determine the orbital data 154 that predicts location, velocity, and so forth of particular satellites 102 at particular times or time intervals. For example, the orbital mechanics system 152 may use data obtained from actual observations from tracking stations, data from the satellites 102, scheduled maneuvers, and so forth to determine the orbital elements. The orbital mechanics system 152 may also consider other data, such as space weather, collision mitigation, orbital elements of known debris, and so forth.

The scheduling system 156 schedules resources to provide communication to the UTs 108. For example, the scheduling system 156 may determine handover data that indicates when communication is to be transferred from the first satellite 102(1) to the second satellite 102(2). Continuing the example, the scheduling system 156 may also specify communication parameters such as frequency, timeslot, and so forth. During operation, the scheduling system 156 may use information such as the orbital data 154, system status data 158, user terminal data 160, and so forth.

The system status data 158 may comprise information such as which UTs 108 are currently transferring data, satellite availability, current satellites 102 in use by respective UTs 108, capacity available at particular ground stations 106, and so forth. For example, the satellite availability may comprise information indicative of satellites 102 that are available to provide communication service or those satellites 102 that are unavailable for communication service. Continuing the example, a satellite 102 may be unavailable due to malfunction, previous tasking, maneuvering, and so forth. The system status data 158 may be indicative of past status, predictions of future status, and so forth. For example, the system status data 158 may include information such as projected data traffic for a specified interval of time based on previous transfers of user data 112. In another example, the system status data 158 may be indicative of future status, such as a satellite 102 being unavailable to provide communication service due to scheduled maneuvering, scheduled maintenance, scheduled decommissioning, and so forth.

The user terminal data 160 may comprise information such a location of a particular UT 108. The user terminal data 160 may also include other information such as a priority assigned to user data 112 associated with that UT 108, information about the communication capabilities of that particular UT 108, and so forth. For example, a particular UT 108 in use by a business may be assigned a higher priority relative to a UT 108 operated in a residential setting. Over time, different versions of UTs 108 may be deployed, having different communication capabilities such as being able to operate at particular frequencies, supporting different signal encoding schemes, having different antenna configurations, and so forth.

The UT 108 includes a communication system 180 to establish communication with one or more satellites 102. The communication system 180 of the UT 108 may include components similar to those of the communication system 120 of a satellite 102 and may perform similar communication functionalities. For example, the communication system 180 may include one or more modems, digital signal processors, power amplifiers, antennas (including at least one antenna that implements multiple antenna elements, such as a phased array antenna), processors, memories, storage devices, communications peripherals, interface buses, and so forth. The UT 108 passes user data 112 between the constellation of satellites 102 and the user device 110. The user data 112 includes data originated by the user device 110 or addressed to the user device 110. The UT 108 may be fixed or in motion. For example, the UT 108 may be used at a residence, or on a vehicle such as a car, boat, aerostat, drone, airplane, and so forth.

The UT 108 includes a tracking system 182. The tracking system 182 uses almanac data 184 to determine tracking data 186. The almanac data 184 provides information indicative of orbital elements of the orbit 104 of one or more satellites 102. For example, the almanac data 184 may comprise orbital elements such as "two-line element" data for the satellites 102 in the constellation that are broadcast or otherwise sent to the UTs 108 using the communication system 180.

The tracking system 182 may use the current location of the UT 108 and the almanac data 184 to determine the tracking data 186 for the satellite 102. For example, based on the current location of the UT 108 and the predicted position and movement of the satellites 102, the tracking system 182 is able to calculate the tracking data 186. The tracking data 186 may include information indicative of azimuth, elevation, distance to the second satellite, time of flight correction, or other information at a specified time. The determination of the tracking data 186 may be ongoing. For example, the UT 108 may determine tracking data 186 every 100 ms, every second, every five seconds, or at other intervals.

With regard to FIG. 1, an uplink is a communication link which allows data to be sent to a satellite 102 from a ground station 106, UT 108, or device other than another satellite 102. Uplinks are designated as UL1, UL2, UL3 and so forth. For example, UL1 is a first uplink from the ground station 106 to the second satellite 102(2). In comparison, a downlink is a communication link which allows data to be sent from the satellite 102 to a ground station 106, UT 108, or device other than another satellite 102. For example, DL1 is a first downlink from the second satellite 102(2) to the ground station 106. The satellites 102 may also be in communication with one another. For example, an intersatellite link 190 provides for communication between satellites 102 in the constellation.

The satellite 102, the ground station 106, the user terminal 108, the user device 110, the management system 150, or other systems described herein may include one or more computer devices or computer systems comprising one or more hardware processors, computer-readable storage media, and so forth. For example, the hardware processors may include application specific integrated circuits (ASICs), field-programmable gate arrays (FPGAs), digital signal processors (DSPs), and so forth. Embodiments may be provided as a software program or computer program including a non-transitory computer-readable storage medium having stored thereon instructions (in compressed or uncompressed form) that may be used to program a computer (or other electronic device) to perform the processes or methods described herein. The computer-readable storage medium may be one or more of an electronic storage medium, a magnetic storage medium, an optical storage medium, a quantum storage medium, and so forth. For example, the computer-readable storage medium may include, but is not limited to, hard drives, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Figure 2:
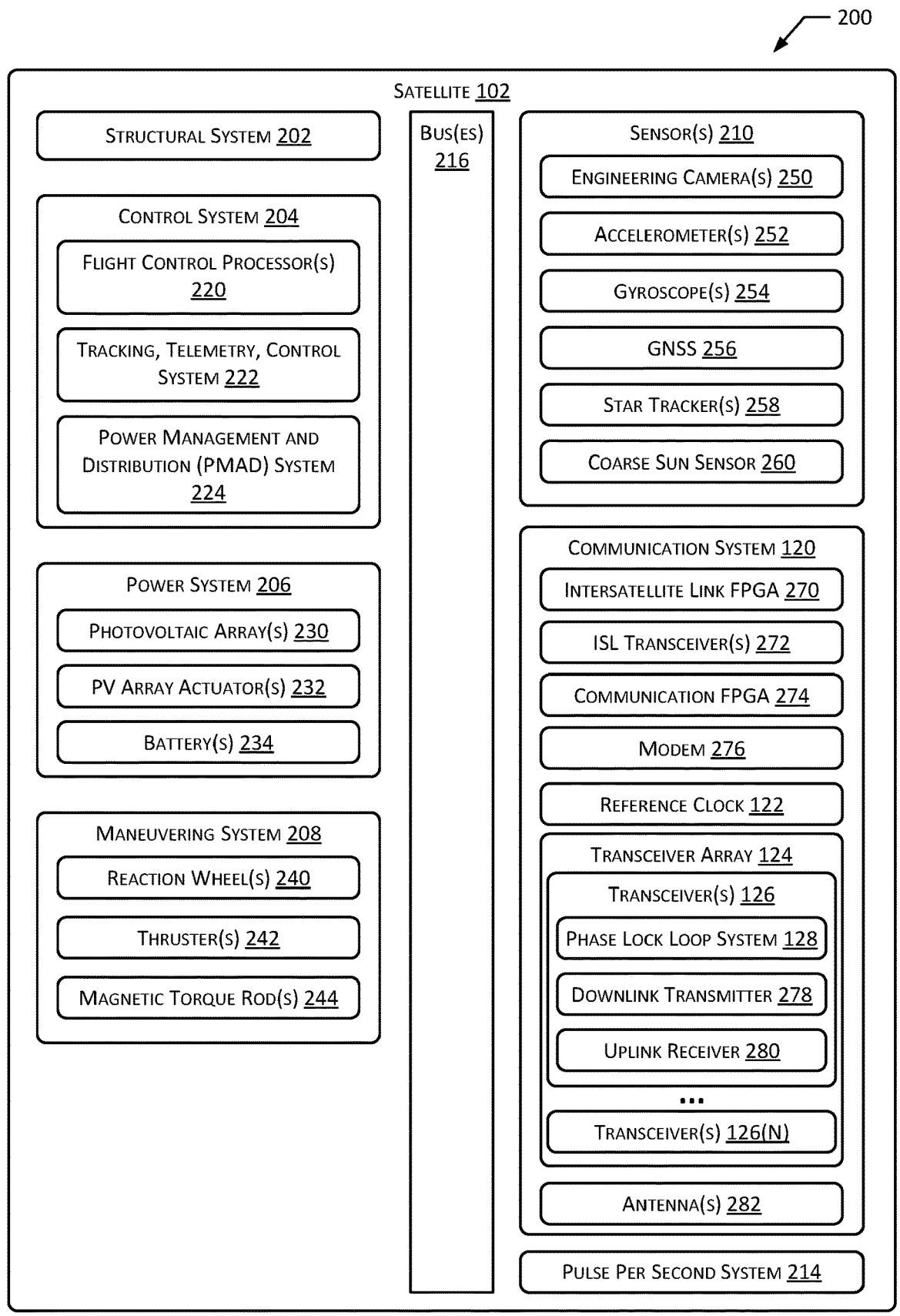
FIG. 2 is a block diagram of some systems associated with the satellite, according to some implementations.

FIG. 2 is a block diagram of some systems associated with the satellite 102, according to some implementations. The satellite 102 may comprise a structural system 202, a control system 204, a power system 206, a maneuvering system 208, one or more sensors 210, and a communication system 120. A pulse per second (PPS) system 214 may be used to provide a timing reference to the systems onboard the satellite 102. One or more buses 216 may be used to transfer data between the systems onboard the satellite 102. In some implementations, redundant buses 216 may be provided. The buses 216 may include, but are not limited to, data buses such as Controller Area Network Flexible Data Rate (CAN FD), Ethernet, Serial Peripheral Interface (SPI), and so forth. In some implementations the buses 216 may carry other signals. For example, a radio frequency bus may comprise coaxial cable, waveguides, and so forth to transfer radio signals from one part of the satellite 102 to another. In other implementations, some systems may be omitted or other systems added. One or more of these systems may be communicatively coupled with one another in various combinations.

The structural system 202 comprises one or more structural elements to support operation of the satellite 102. For example, the structural system 202 may include trusses, struts, panels, and so forth. The components of other systems may be affixed to, or housed by, the structural system 202. For example, the structural system 202 may provide mechanical mounting and support for solar panels in the power system 206. The structural system 202 may also provide for thermal control to maintain components of the satellite 102 within operational temperature ranges. For example, the structural system 202 may include louvers, heat sinks, radiators, and so forth.

The control system 204 provides various services, such as operating the onboard systems, resource management, providing telemetry, processing commands, and so forth. For example, the control system 204 may direct operation of the communication system 120. The control system 204 may include one or more flight control processors 220. The flight control processors 220 may comprise one or more processors, FPGAs, and so forth. A tracking, telemetry, and control (TTC) system 222 may include one or more processors, radios, and so forth. For example, the TTC system 222 may comprise a dedicated radio transmitter and receiver to receive commands from a ground station 106, send telemetry to the ground station 106, and so forth. A power management and distribution (PMAD) system 224 may direct operation of the power system 206, control distribution of power to the systems of the satellite 102, control battery 234 charging, and so forth.

The power system 206 provides electrical power for operation of the components onboard the satellite 102. The power system 206 may include components to generate electrical energy. For example, the power system 206 may comprise one or more photovoltaic arrays 230 comprising a plurality of photovoltaic cells, thermoelectric devices, fuel cells, and so forth. One or more PV array actuators 232 may be used to change the orientation of the photovoltaic array(s) 230 relative to the satellite 102. For example, the PV array actuator 232 may comprise a motor. The power system 206 may include components to store electrical energy. For example, the power system 206 may comprise one or more batteries 234, fuel cells, and so forth.

The maneuvering system 208 maintains the satellite 102 in one or more of a specified orientation or orbit 104. For example, the maneuvering system 208 may stabilize the satellite 102 with respect to one or more axes. In another example, the maneuvering system 208 may move the satellite 102 to a specified orbit 104. The maneuvering system 208 may include one or more of reaction wheel(s) 240, thrusters 242, magnetic torque rods 244, solar sails, drag devices, and so forth. The thrusters 242 may include, but are not limited to, cold gas thrusters, hypergolic thrusters, solid-fuel thrusters, ion thrusters, arcjet thrusters, electro-thermal thrusters, and so forth. During operation, the thrusters may expend propellent. For example, an electrothermal thruster may use water as propellent, using electrical power obtained from the power system 206 to expel the water and produce thrust. During operation, the maneuvering system 208 may use data obtained from one or more of the sensors 210.

The satellite 102 includes one or more sensors 210. The sensors 210 may include one or more engineering cameras 250. For example, an engineering camera 250 may be mounted on the satellite 102 to provide images of at least a portion of the photovoltaic array 230. Accelerometers 252 provide information about acceleration of the satellite 102 along one or more axes. Gyroscopes 254 provide information about rotation of the satellite 102 with respect to one or more axes. The sensors 210 may include a global navigation satellite system (GNSS) 256 receiver, such as a Global Positioning System (GPS) receiver, to provide information about the position of the satellite 102 relative to Earth. In some implementations the GNSS 256 may also provide information indicative of velocity, orientation, and so forth. One or more star trackers 258 may be used to determine an orientation of the satellite 102. A coarse sun sensor 260 may be used to detect the sun, provide information on the relative position of the sun with respect to the satellite 102, and so forth. The satellite 102 may include other sensors 210 as well. For example, the satellite 102 may include a horizon detector, radar, lidar, and so forth.

The communication system 120 provides communication with one or more other devices, such as other satellites 102, ground stations 106, user terminals 108, and so forth. The communication system 120 may include one or more modems 276, digital signal processors, power amplifiers, antennas 282 (including at least one antenna that implements multiple antenna elements, such as a phased array antenna), processors, memories, storage devices, communications peripherals, interface buses, and so forth. Such components support communications with other satellites 102, ground stations 106, user terminals 108, and so forth using radio frequencies within a desired frequency spectrum. The communications may involve multiplexing, encoding, and compressing data to be transmitted, modulating the data to a desired radio frequency, and amplifying it for transmission. The communications may also involve demodulating received signals and performing any necessary de-multiplexing, decoding, decompressing, error correction, and formatting of the signals. Data decoded by the communication system 120 may be output to other systems, such as to the control system 204, for further processing. Output from a system, such as the control system 204, may be provided to the communication system 120 for transmission.

The communication system 120 may include hardware to support the intersatellite link 190. For example, an intersatellite link FPGA 270 may be used to modulate data that is sent and received by an ISL transceiver 272 to send data between satellites 102. The ISL transceiver 272 may operate using radio frequencies, optical frequencies, and so forth.

In the implementation depicted here, the transceiver 126 comprises the PLL system 128, a downlink transmitter 278 and an uplink receiver 280. A communication FPGA 274 may be used to facilitate communication between the satellite 102 and the ground stations 106, UTs 108, and so forth. For example, the communication FPGA 274 may direct operation of a modem 276 to modulate signals sent using a downlink transmitter 278 and demodulate signals received using an uplink receiver 280. The transceivers 126 may be connected to one or more antennas 282. The satellite 102 may include one or more antennas 282. For example, one or more parabolic antennas may be used to provide communication between the satellite 102 and one or more ground stations 106. In another example, a phased array antenna may be used to provide communication between the satellite 102 and the UTs 108.

The phased array antenna contains many elements and uses slight differences in timing or phase of the signals to produce a beamforming effect that directs a signal to transmit or receive in a particular direction relative to the phased array antenna. For example, a phased array antenna system may include antenna control electronics controlling a radio frequency (RF) feeding network. The RF feeding network may include a plurality of signal conditioning components interposed between antenna elements and the transceivers 126. The signal conditioning components introduce one or more of a phase modulation or an amplitude modulation to the signal sent to the antenna elements. This introduces a progressive phase modulation which produces interference in the individual transmission of each antenna element, producing directivity or gain in a particular direction. The phase modulation imposed on each antenna element will differ and will be dependent on a spatial location of a communication target that determines an optimum beam vector (e.g., where the beam vector is found by one or more of maximizing signal intensity or connection strength). The optimum beam vector may change with time, such as when a communication target moves relative to the phased array antenna system.

Figure 3:
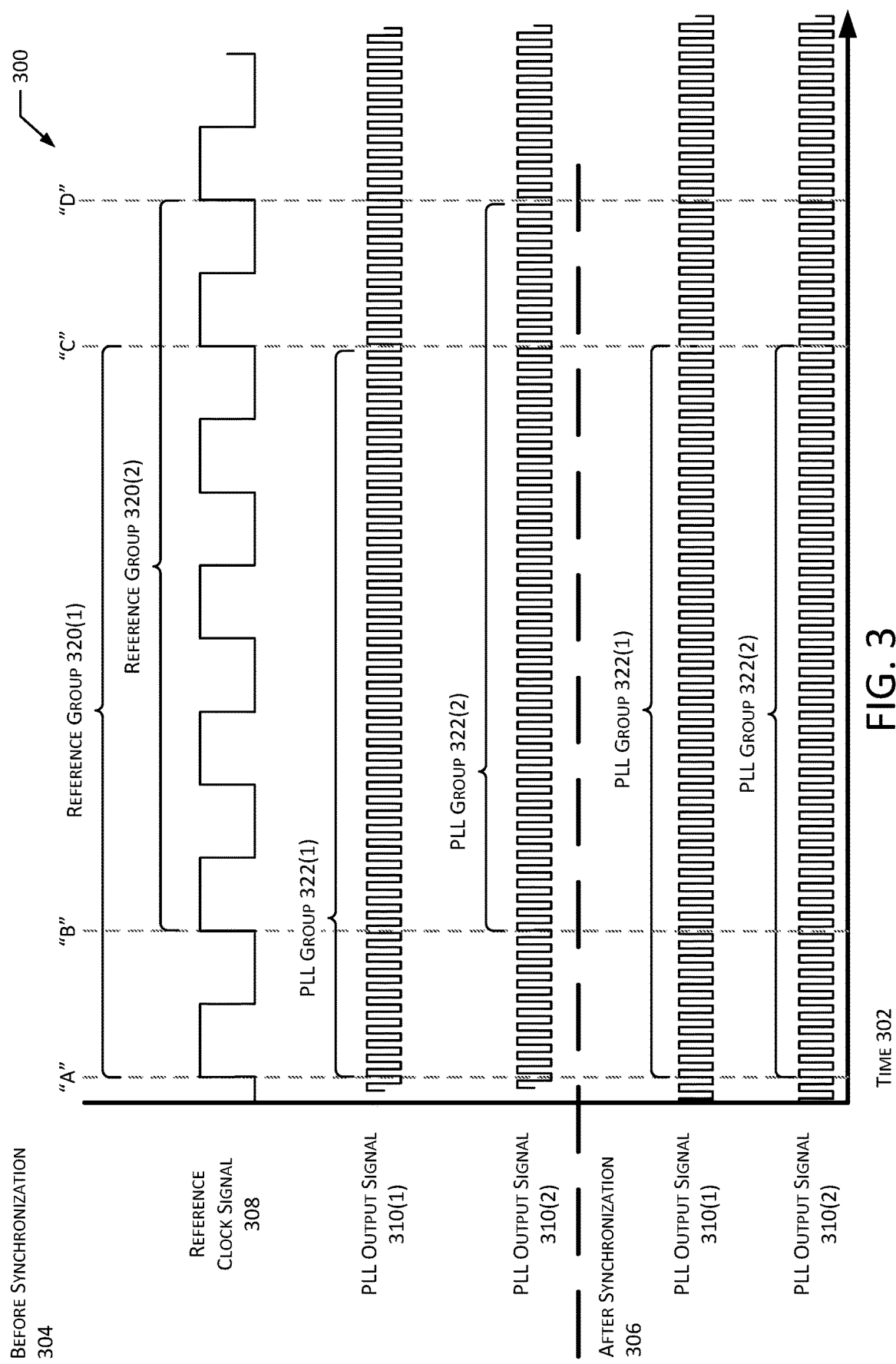
FIG. 3 illustrates timing diagrams of a reference clock signal and PLL outputs before and after synchronization, according to some implementations.

FIG. 3 illustrates several timing diagrams 300. In this diagram time 302 increases from left to right. Shown here are signals before synchronization 304 and after synchronization 306.

A representation of a reference clock signal 308 produced by the reference clock 122 is shown. A first reference group 320(1) is shown that extends for an interval of time 302 beginning at time "A" that includes five (5) pulses, as counted from a rising edge of each pulse. A second reference group 320(2) is shown that begins at time "B" and also extends for five pulses.

A first PLL output signal 310(1) is shown as produced by a first PLL system 128(1) prior to synchronization. A first PLL group 322(1) comprising 51 pulses and corresponding to the first reference group 320(1) is shown. Also shown is a second PLL output signal 310(2) as produced by a second PLL system 128(2) prior to synchronization. A second PLL group 322(2) comprising 51 pulses and corresponding to the second reference group 320(2) is shown.

Before synchronization 304, the PLL groups 322(1) and 322(2) of the PLL output signals 310(1) and 310(2) are aligned to respective reference groups 320(1) and 320(2), but not to each other because of the fractional ratio (51/5). For example, the first PLL group 322(1) is aligned with the rising edge of the first reference group 320(1) while the second PLL group 322(2) is aligned with the rising edge of the second reference group 320(2). As a result, these signals are locked, but have different phases. If left uncorrected, this misalignment would introduce substantial errors into the phase of the signals produced by the respective transceivers 126, impairing the ability to perform beamforming using a phased array.

In comparison, after synchronization 306 using the circuitry and techniques described in this disclosure, the PLL output signals 310(1) and 310(2) and their corresponding PLL groups 322(1) and 322(2) are now tightly aligned to the same reference group 320(1), and to one another. As a result of this tight timing, intentional phase delays associated with digital beamforming techniques may be used to produce beamforming effects in a phased antenna array.

Figure 4:
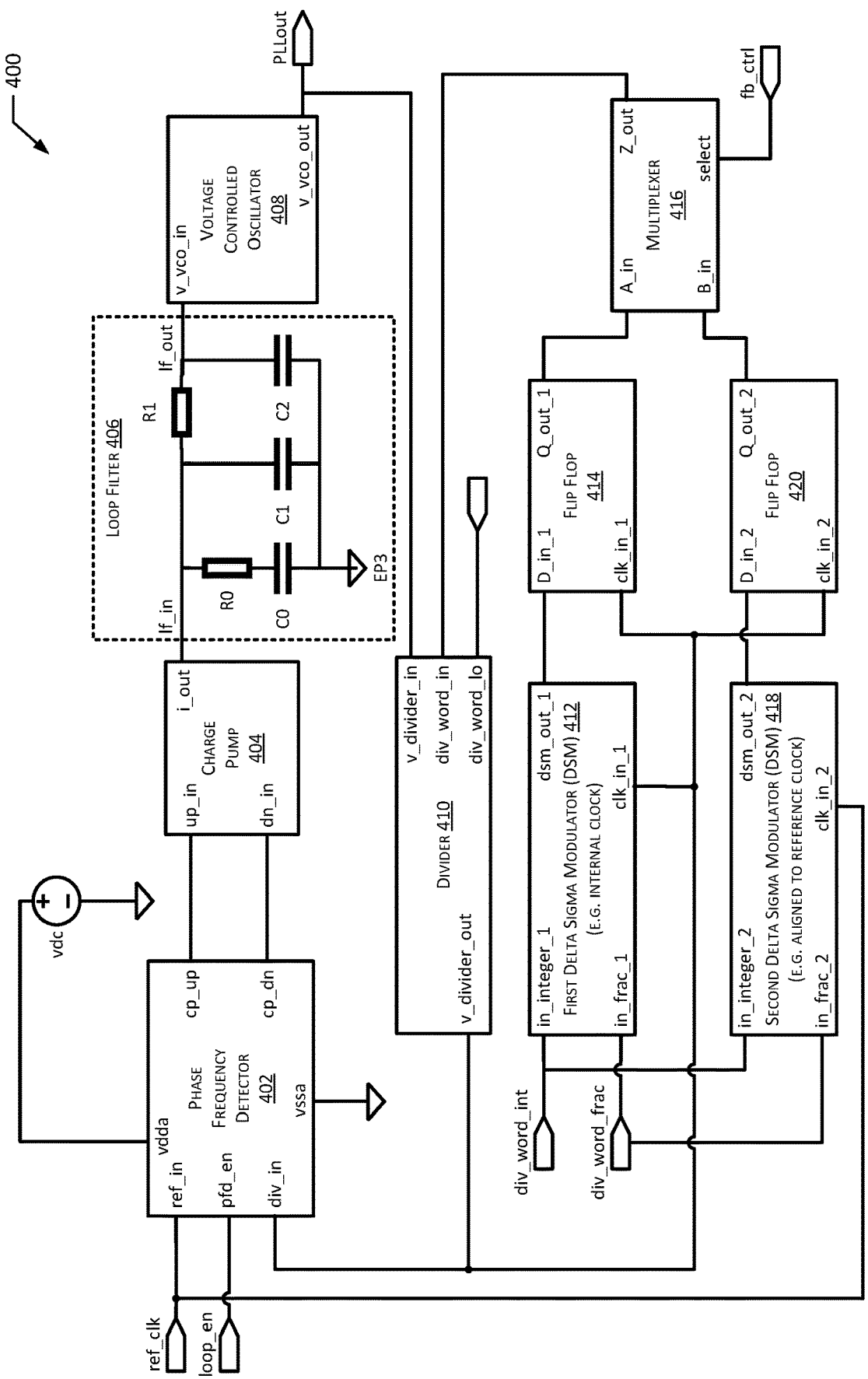
FIG. 4 is a schematic of a dual delta sigma modulator (DSM) PLL, according to some implementations.

FIG. 4 is a schematic 400 of a dual delta sigma modulator (DSM) PLL system 128, according to some implementations. The PLL system 128 may comprise a phase frequency detector (PFD) 402, a charge pump (CP) 404, a loop filter (LF) 406, a voltage controlled oscillator (VCO) 408, a divider 410, a first delta sigma modulator (DSM) 412, a first flip flop 414, a multiplexer 416, a second DSM 418, and a second flip flop 420.

The PFD 402 accepts voltage from a direct current (DC) voltage source vdc at a vdda terminal and is connected to ground at a vssa terminal. The PFD 402 includes a reference input ("ref_in"), a PFD enable input (pfd_en), a first divider input ("div_in"), a first charge pump output ("cp_up"), and a second charge pump output ("cp_dn"). The reference input of the PFD 402 is connected to the reference clock (ref_clk) output from the reference clock 122.

The CP 404 includes a first input ("up_in") and a second input ("dn_in"). The CP 404 also includes a charge pump output ("i_out"). The first charge pump output of the PFD 402 is connected to the first input of the CP 404. The second charge pump output of the PFD 402 is connected to the second input of the CP 404.

The loop filter 406 comprises a loop filter input ("tin") and a loop filter output ("tout"). The charge pump output is connected to the loop filter input.

The VCO 408 comprises a tuning input ("v_vco_in") and a VCO output ("v_vco_out"). The tuning input is connected to the loop filter output.

The divider 410 comprises a second divider input ("v_divider_in"), a divider word input ("div_word_in"), a divider word low ("div_word_lo"), and a divider output ("v_divider_out"). The second divider input is connected to the VCO output. The divider output is connected to a first node. The first node is connected to the first divider input of the PFD 402.

The first DSM 412 includes a first clock input ("clk_in_1"), a first word integer input ("in_integer_1"), a first word fraction input ("in_frac_1"), and a first DSM output ("dsnn_out_1"). The first clock input is connected to the first node, that is the divider output.

The first flip flop 414 comprises a first flip flop input ("D_in_1"), a first flip flop clock input ("clk_in_1"), and a first flip flop output ("Q_out_1"). The first DSM output is connected to the first flip flop input. The first flip flop clock input is connected to the first node, that is the divider output.

The multiplexer 416 comprises a first multiplexer input ("A_in"), a second multiplexer input ("B_in"), a "select" input allows for selection of the desired input to provide as output at a multiplexer output ("Z_out"). For example, a controller may assert a signal on the "select" input after determination of an event to switch the multiplexer output from using the output from the first flip flop 414 associated with the first DSM 412 to the second flip flop 420 that is associated with the second DSM 418. The determination of the event may comprise one or more of determining a threshold interval of time has elapsed, receipt of a signal from another device, receiving a signal, determining a difference between one or more characteristics of two or more signals is less than a threshold value, and so forth. For example, the controller may operate a timer that, when elapsed, asserts the signal on the "select" input. In another example, if a frequency difference between two or more PLL output signals 310 is less than a threshold value, an event may be determined and a signal may be asserted on the "select" input.

The first multiplexer input is connected to the first flip flop output. The second multiplexer input is connected to the second flip flop output.

Switching circuitry shown in this implementation comprises the first flip flop 414, the multiplexer 416, and the second flip flop 420 and determines whether the first DSM 412 or the second DSM 418 is used by the divider 410. In other implementations other circuitry may be used to control which DSM is in use by the PLL system 128.

The second DSM 418 includes a second clock input ("clk_in_2"), a second word integer input ("in_integer_2"), a second word fraction input ("in_frac_2"), and a second DSM output ("dsm_out_2"). The second clock input is connected to the reference clock input.

The second flip flop 420 comprises a second flip flop input ("D_in_2"), a second flip flop clock input ("clk_in_2"), and a second flip flop output ("Q_out_2"). The second flip flop clock input is connected to the first node, that is the divider output.

The first DSM 412 and the second DSM 418 receive their respective integer word inputs and fractional word inputs from the same source.

The circuit described allows for synchronization of many PLL systems 128 that each may vary substantially from one another. As described above, PLL systems 128 may vary in their operation during use due to variations in the process used to manufacture them, voltage differences, temperature differences, and so forth. In some implementations, the transceivers 126 within the transceiver array 124 may vary as well. For example, a first transceiver 126(1) may have a first PLL system 128(1) with a first loop filter 406(1) having a first bandwidth of 1 MHz. The divider 410(1) of the first PLL system 128(1) may have a first divider state and a VCO 408(1) initial phase of 60°. The first PLL system 128(1) may start after a 13 ns delay in this example. Continuing the example, a second transceiver 126(2) may have a second PLL system 128(2) with a second loop filter 406(2) having a second bandwidth of 100 kHz. The divider 410(2) of the second PLL system 128(2) may have a second divider state that is 180° from the first divider state and a VCO 408(2) initial phase of 200°. The second PLL system 128(2) may start after a 101 ns delay in this example. However, given these substantial variations in the parameters between the first PLL system 128(1) and the second PLL system 128(2), they are both brought into alignment with one another using the circuit and techniques described herein.

Figure 5:
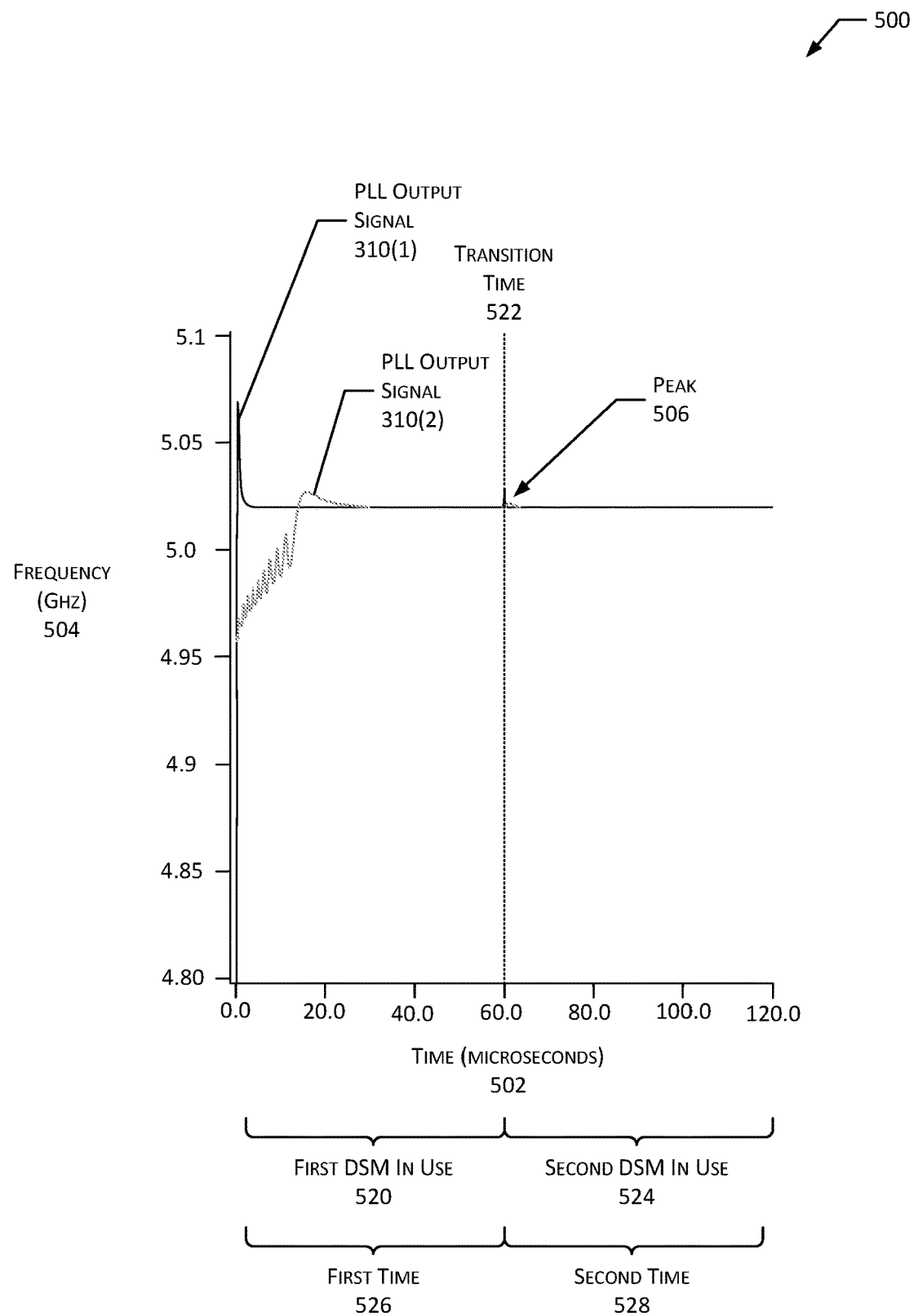
FIG. 5 is a graph of PLL output during coarse timing alignment using the first DSM and after fine alignment using the second DSM, according to some implementations.

FIG. 5 is a graph 500 of PLL output during coarse timing alignment using the first DSM 412 and after fine alignment using the second DSM 418, according to some implementations. In the graph 500, time 502 is indicated along a horizontal axis. A vertical axis indicates frequency 504 of the output.

The first PLL output signal 310(1) produced by a first PLL system 128(1) and the second PLL output signal 310(2) produced by a second PLL system 128(2) are shown. A first time 526 extends from time 0 to 60 microseconds. A second time 528 extends from time 60 microseconds until 120 microseconds. The first DSM 412 is in use 520 during the first time 526. The second DSM 418 is in use 524 during the second time 528. The PLL system 128 transitions from using the first DSM 412 to the second DSM 418 at the transition time 522. Before the transition time 522, the second DSM 418 may be one or more of powered on or activated responsive to a kickstart signal. For example, the kickstart signal may be provided at some time before the transition time 522, such as at 30 microseconds.

At the transition time 522, the first PLL systems 128(1) and the second PLL system 128(2) each switch from using their respective first DSM 412 to their respective second DSM 418. At the transition time 522 a peak 506 occurs in the output signals 310 as a result of the transition from the first DSM 412 to the second DSM 418 in the respective PLL systems 128. The peak 506 rapidly dissipates and the respective PLL output signals 310 settle to the desired frequency 504.

In one implementation, the transition time 522 is specified as a predetermined time. For example, a controller may specify when the PLL system 128 transitions from using the first DSM 412 to the second DSM 418. The transition time 522 may vary between PLL systems 128. For example, the first PLL system 128(1) may transition at 58 microseconds, the second PLL system 128(2) may transition at 60 microseconds, a third PLL system 128(3) may transition at 59 microseconds, and so forth.

In another implementation, the transition time 522 may not be a predetermined time. For example, comparison circuitry may be used to determine when the first PLL output signal 310(1) is within a threshold frequency variance and threshold phase variance of a second PLL output signal 310(2). At that time, determined by the comparison circuitry, the first PLL system 128(1) may transition from using the first DSM 412 to the second DSM 418.

Figure 6:
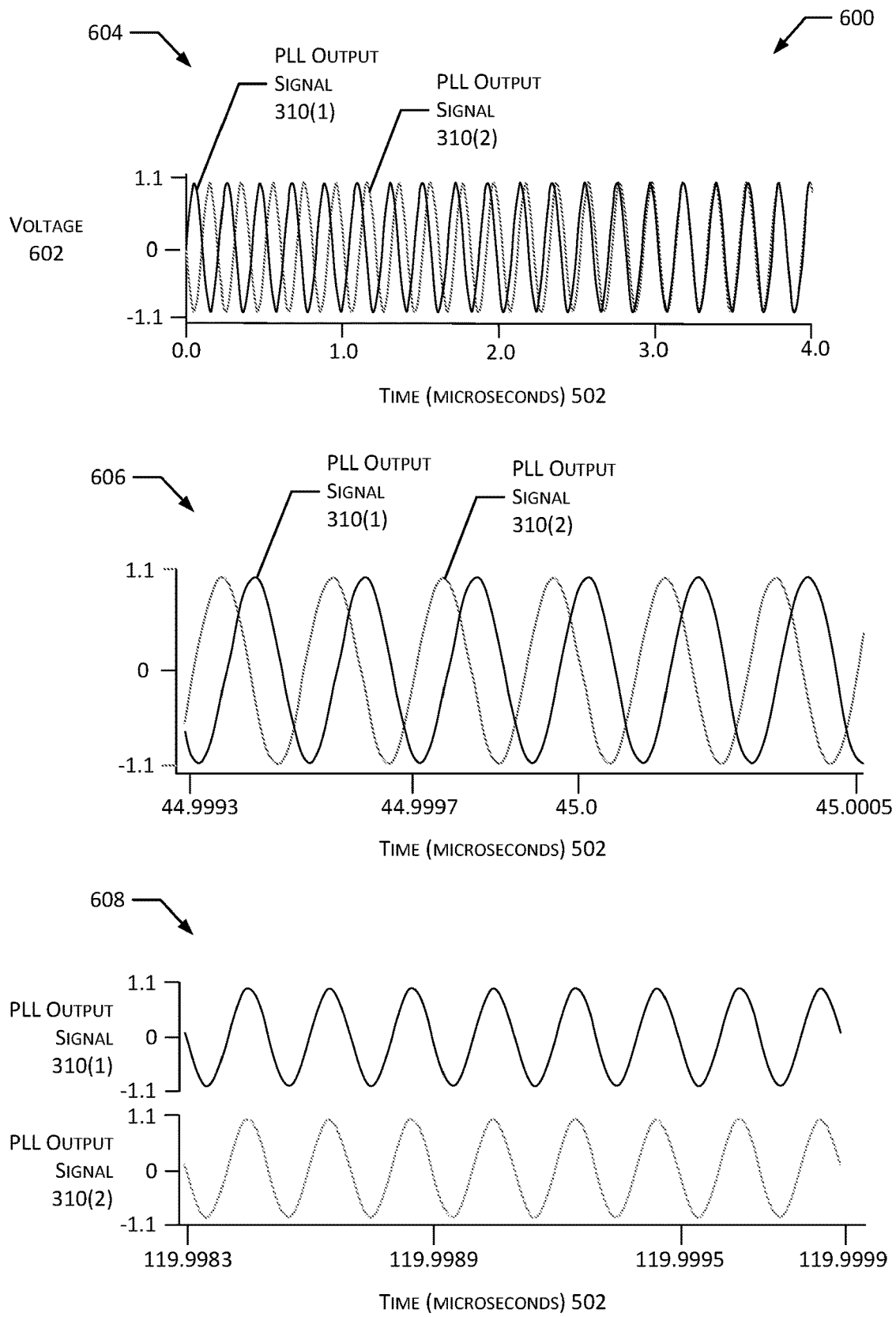
FIG. 6 illustrates waveforms of PLL output signals before and after alignment, according to some implementations.

FIG. 6 illustrates three graphs 600 of waveforms of PLL output signals 310 before and after alignment, according to some implementations. In these graphs, time 502 is indicated along the horizontal axis. The vertical axis indicates a voltage 602 of the PLL output signal 310.

At 604 the first PLL output signal 310(1) produced by the first PLL system 128(1) and the second PLL output signal 310(2) produced by the second PLL system 128(2) are shown from time 0 to 4 microseconds. These output signals 310 are not synchronized with one another. During this time, the respective PLL systems 128 are using their respective first DSMs 412.

At 606 the output signals 310 are shown from time 44.9993 to 45.0005 microseconds. The first PLL output signal 310(1) and the second PLL output signal 310(2) exhibit substantially the same frequency, but are out of phase. For example, the delay between the two output signals 310 may be approximately 34 picoseconds. If no further alignment was performed, this mismatch in phase would significantly impair or entirely prevent proper beamforming. During this time, the respective PLL systems 128 are using their respective first DSMs 412.

In some implementations, a frequency difference between two signals may be used to determine occurrence of an event. For example, a frequency difference may be determined between the PLL output signal 310(1) and the PLL output signal 310(2). In another example, a frequency difference may be determined between the PLL output signal 310 and another signal, such as the reference clock signal 308. If the frequency difference is less than a threshold value, an event may be determined. Responsive to this event, the system may transition from using the first DSM 412 to using the second DSM 418 as input to the divider 410.

At 608 the output signals 310 are shown from time 119.9983 to 199.9999 microseconds. At this time, the PLL systems 128 are using their respective second DSMs 418. For clarity, the representations of the output signals 310 have been separated vertically, with the first PLL output signal 310(1) represented above the second PLL output signal 310(2). The output signals 310 now exhibit substantially the same frequency, and their respective phases have been substantially aligned. For example, delay between the two output signals 310 may be less than 200 femtoseconds. Compared to the output signals 310 at 606, there is a substantial improvement in synchronization. Beamforming techniques, such as introduction of intentional phase delays to produce a beamforming effect, may be introduced.

Figure 7:
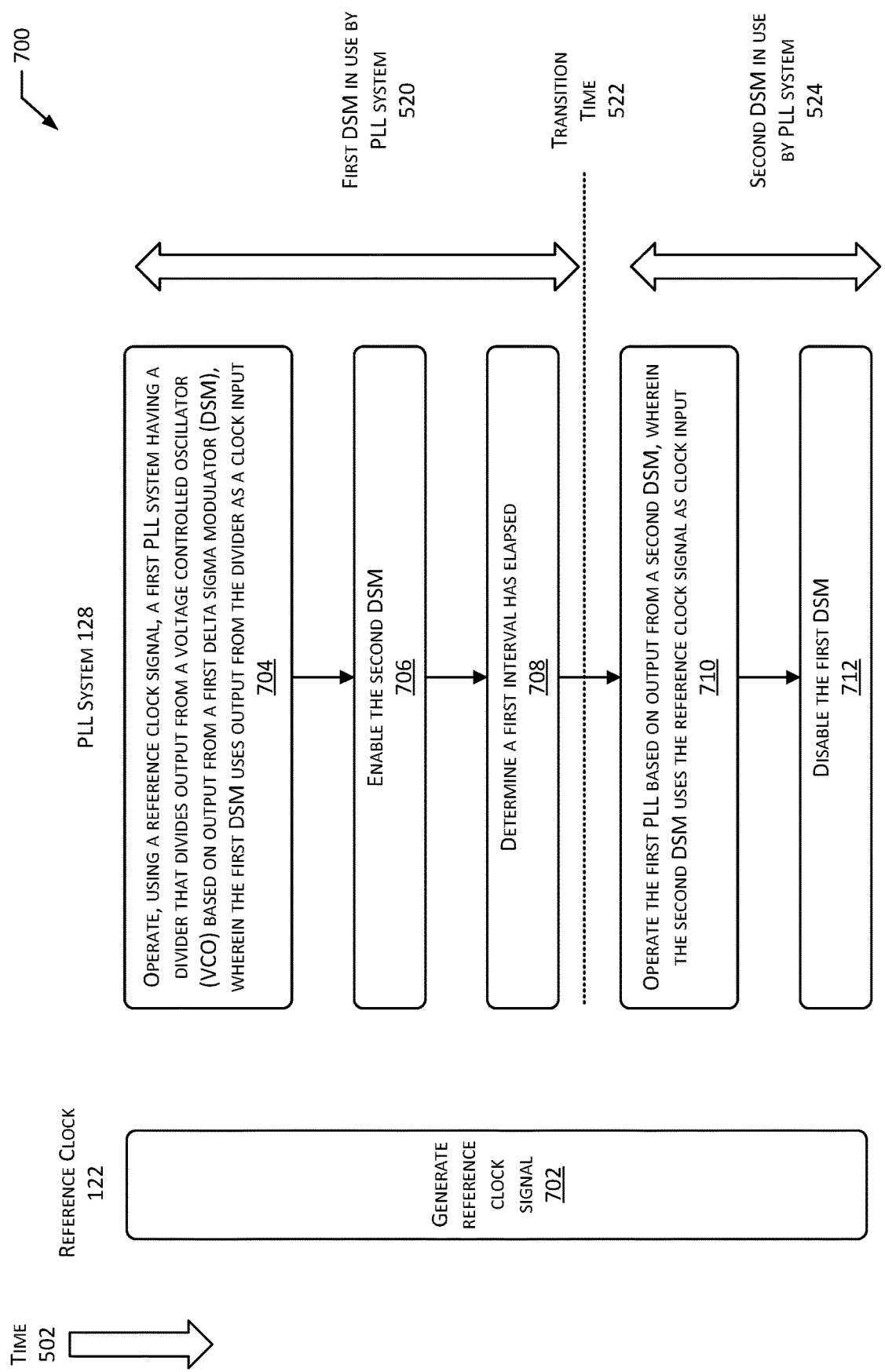
FIG. 7 is a flow diagram of a process of using a first DSM and a second DSM to align a PLL to a reference clock, according to some implementations.

FIG. 7 is a flow diagram 700 of a process of using a first DSM 412 and a second DSM 418 to align a PLL system 128 to the reference clock 122, according to some implementations. For ease of illustration, the process is discussed with respect to a single PLL system 128. It is understood that the process may be implemented to simultaneously synchronize a plurality of PLL systems 128 to the reference clock 122.

In this diagram, time 502 increases down the page. At 702 The reference clock 122 generates the reference clock signal 308. At 704, a first PLL system 128 is operated using the reference clock signal 308. The first PLL system 128 comprises a divider 410 that divides output from a VCO 408 based on output from a first DSM 412. The first DSM 412 uses output from the divider 410 as a clock input.

At 706 the second DSM 418 is enabled. For example, power may be provided to the second DSM 418. In another example, the second DSM 418 may receive a kickstart signal.

At 708 a first interval has been determined to have elapsed. For example, a controller, timer, or other device may indicate that a predetermined time has elapsed. The predetermined time may be initiated after one or more of initial power up of the controller, receipt of a reset signal, or a change in frequency of the PLL system 128 that exceeds a threshold value.

At 710 the first PLL system 128 is operated based on output from the second DSM 418. The second DSM 418 uses the reference clock signal 308 as a clock input. After the initial peak 506, the PLL systems 128 settle to the desired output frequency 504 and are now aligned in frequency and phase.

At 712 the first DSM 412 may be disabled. For example, power may be removed from the first DSM 412. The PLL system 128 may reduce power consumption and heat dissipation by the enabling of the second DSM 418 and the disabling of the first DSM 412 after the transition time 522. Because the first DSM 412 is not used by the PLL system 128 after the transition time 522, the first DSM 412 may be powered down.

The circuitry, processes and methods discussed in this disclosure may be implemented in hardware, software, or a combination thereof. In the context of software, the described operations represent computer-executable instructions stored on one or more computer-readable storage media that, when executed by one or more hardware processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

Embodiments may be provided as a software program or computer program product including a non-transitory computer-readable storage medium having stored thereon instructions (in compressed or uncompressed form) that may be used to program a computer (or other electronic device) to perform processes or methods described herein. The computer-readable storage medium may be one or more of an electronic storage medium, a magnetic storage medium, an optical storage medium, a quantum storage medium, and so forth. For example, the computer-readable storage medium may include, but is not limited to, hard drives, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case, and a variety of alternative implementations will be understood by those having ordinary skill in the art.

Additionally, those having ordinary skill in the art will readily recognize that the techniques described above can be utilized in a variety of devices, physical spaces, and situations. Although the subject matter has been described in language specific to structural features or methodological acts, it is to be understood that the subject matter defined in the appended claims is not necessarily limited to the specific features or acts described. Rather, the specific features and acts are disclosed as illustrative forms of implementing the claims.

What is claimed is:

1. A system comprising:
   a reference clock to produce a reference clock signal at a reference clock output;
   a controller;
   a first fractional-N phase lock loop (PLL) comprising a phase frequency detector (PFD) connected to (i) the reference clock output, (ii) a first divider input of a divider, and (iii) a charge pump;
   the charge pump connected to a loop filter;
   the loop filter connected to a voltage controlled oscillator (VCO);
   the VCO connected to the divider;
   the divider connected to (i) the PFD, (ii) a first delta sigma modulator (DSM), (iv) a first flip flop, and (iv) a second flip flop;
   the first DSM connected to the first flip flop;
   a second DSM connected to the reference clock output, and to the second flip flop; and
   a multiplexer connected to (i) the first flip flop, (ii) the second flip flop, (ii) the controller; and (iv) the divider.

2. The system of claim 1, wherein the first fractional-N PLL operates using the first DSM from a first time to a second time and transitions to using the second DSM from the second time to a third time.

3. The system of claim 1, wherein the controller transitions the divider from using the first DSM to using the second DSM at a predetermined time after one or more of:
   initial power up of the controller,
   receipt of a reset signal, or
   a change in frequency that exceeds a threshold value.

4. The system of claim 1, wherein:
   after the controller transitions the divider to use the second DSM, the first DSM is deactivated while continuing to operate the first fractional-N PLL using the second DSM.

5. The system of claim 1, further comprising:
   a transceiver, wherein the first fractional-N PLL is used as a local oscillator for the transceiver.

6. The system of claim 1, further comprising:
   a first plurality of transceivers, wherein each transceiver of the first plurality of transceivers is associated with a fractional-N PLL comprising at least two DSMs;
   a signal conditioning component connected to the first plurality of transceivers, wherein the signal conditioning component introduces a selective phase variance to produce a beamforming effect; and a phased array antenna connected to the signal conditioning component.

7. The system of claim 1, further comprising a second fractional-N PLL comprising:
a second controller;
a second divider;
a third DSM; and
a fourth DSM; and
wherein the controller transitions the divider from using the first DSM to using the second DSM at a first time; and
wherein the second controller transitions the second divider from using the third DSM to using the fourth DSM at a second time that is different from the first time.

8. The system of claim 1, the first fractional-N PLL further comprising:
a first loop filter having a first bandwidth; and
the system further comprising a second fractional-N PLL further comprising:
a second loop filter having a second bandwidth different from the first bandwidth; and
wherein the first fractional-N PLL and the second fractional-N PLL are synchronized with the reference clock.

9. A system comprising:
a phase lock loop (PLL) comprising:
a divider comprising:
a first divider input connected to an output of a first oscillator;
a divider word input; and
a first divider output;
a first delta sigma modulator (DSM) comprising:
a first clock input connected to the first divider output;
a first word integer input connected to a first node;
a first word fraction input connected to a second node; and
a first DSM output;
a second DSM comprising:
a second clock input connected to a reference clock;
a second word integer input connected to the first node;
a second word fraction input connected to the second node; and
a second DSM output; and
switching circuitry to connect the divider word input to one of:
the first DSM output, or
the second DSM output.

10. The system of claim 9, the switching circuitry comprising:
a first flip flop comprising:
a first flip flop input connected to the first DSM output;
a first flip flop clock input connected to the first divider output; and
a first flip flop output;
a second flip flop comprising:
a second flip flop input connected to the second DSM output;
a second flip flop clock input connected to the first divider output; and
a second flip flop output; and
a multiplexer comprising:
a first multiplexer input connected to the first flip flop output;
a second multiplexer input connected to the second flip flop output;
a select input connected to a controller; and
a multiplexer output connected to the divider word input.

11. The system of claim 9, further comprising:
a controller to operate the switching circuitry to:
operate the PLL using the first DSM from a first time to a second time; and
operate the PLL using the second DSM after the second time.

12. The system of claim 9, further comprising:
a controller operates the switching circuitry to transition the divider from using the first DSM to using the second DSM at a predetermined time after one or more of:
initial power up of the controller,
receipt of a reset signal, or
a change in frequency that exceeds a threshold value.

13. The system of claim 9, wherein the first DSM is deactivated after the second DSM output is connected to the divider word input.

14. The system of claim 9, further comprising:
one or more transceivers, wherein the PLL is used as a local oscillator for the one or more transceivers.

15. The system of claim 9, further comprising:
a first plurality of transceivers, wherein each transceiver of the first plurality of transceivers is connected to a PLL comprising at least two DSMs; and
a signal conditioning component connected to the first plurality of transceivers, wherein the signal conditioning component introduces a selective phase variance to produce a beamforming effect; and
a phased array antenna connected to the signal conditioning component.

16. The system of claim 9, the PLL further comprising:
a first loop filter having a first bandwidth; and
the system further comprising a second PLL further comprising:
a second loop filter having a second bandwidth different from the first bandwidth; and
wherein the PLL and the second PLL are synchronized with the reference clock.

17. A method comprising:
operating, at a first time, a fractional-N phase lock loop (PLL) using a divider that accepts output from a first delta sigma modulator (DSM) as input;
determining, at a second time, occurrence of a first event;
transitioning, after the second time, the input to the divider from the first DSM to output from a second DSM, wherein the second DSM uses a reference clock signal as a second clock input; and
operating the divider using the output from the second DSM.

18. The method of claim 17, wherein the first event comprises one or more of:
determining a first interval has elapsed at a third time,
determining a frequency difference between output from the fractional-N PLL and a second signal is less than a threshold value, or
receiving a signal.

19. The method of claim 17, further comprising:
deactivating, after the second time, the first DSM.

20. The method of claim 17, further comprising:
synchronizing, relative to the reference clock signal, phase and frequency of a plurality of Pas, wherein each PLL comprises at least two DSMs.

* * * * *

UNITED STATES PATENT AND TRADEMARK OFFICE
CERTIFICATE OF CORRECTION

PATENT NO. : 10,931,291 B1
APPLICATION NO. : 16/921069
DATED : February 23, 2021
INVENTOR(S) : Satwik Patnaik Page 1 of 1

It is certified that error appears in the above-identified patent and that said Letters Patent is hereby corrected as shown below:

In the Claims

Column 16, Claim 1, Line 35 reads: "modulator (DSM), (iv) a first flip flop, and (iv) a second"
Where it should read: --modulator (DSM), (iii) a first flip flop, and (iv) a second--

Column 16, Claim 1, Line 41 reads: "second flip flop, (ii) the controller; and (iv) the divider"
Where it should read: --second flip flop, (iii) the controller; and (iv) the divider--

Column 18, Claim 20, Line 63 reads: "phase and frequency of a plurality of Pas, wherein each"
Where it should read: --phase and frequency of a plurality of PLLs, wherein each--

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*